(12) United States Patent
Sekiguchi et al.

(10) Patent No.: US 7,399,693 B2
(45) Date of Patent: Jul. 15, 2008

(54) SEMICONDUCTOR FILM MANUFACTURING METHOD AND SUBSTRATE MANUFACTURING METHOD

(75) Inventors: Yoshinobu Sekiguchi, Machida (JP); Takao Yonehara, Kawasaki (JP); Makoto Koto, Machida (JP); Masahiro Okuda, Sagamihara (JP); Tetsuya Shimada, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 181 days.

(21) Appl. No.: 10/566,170

(22) PCT Filed: Jun. 15, 2005

(86) PCT No.: PCT/JP2005/011388

§ 371 (c)(1),
(2), (4) Date: Jan. 27, 2006

(87) PCT Pub. No.: WO2006/001285

PCT Pub. Date: Jan. 5, 2006

(65) Prior Publication Data

US 2006/0246688 A1    Nov. 2, 2006

(30) Foreign Application Priority Data

Jun. 23, 2004   (JP) ............................. 2004-185237

(51) Int. Cl.
*H01L 21/44* (2006.01)
(52) U.S. Cl. ..................................................... 438/607
(58) Field of Classification Search ......... 438/602–607; 257/744–747, E21.09–21, 461–465
See application file for complete search history.

(56) References Cited

U.S. PATENT DOCUMENTS

| | | | |
|---|---|---|---|
| 5,371,037 A | 12/1994 | Yonehara | 437/86 |
| 5,712,199 A | 1/1998 | Nakagawa et al. | 438/62 |
| 5,750,000 A | 5/1998 | Yonehara et al. | 156/630.1 |
| 5,755,914 A | 5/1998 | Yonehara | 156/281 |
| 5,763,288 A | 6/1998 | Sakaguchi et al. | 438/455 |
| 5,840,616 A | 11/1998 | Sakaguchi et al. | 438/459 |

(Continued)

FOREIGN PATENT DOCUMENTS

JP    2001-192300    7/2001

(Continued)

OTHER PUBLICATIONS

O. Ambacher, et al., "Laser-Induced Liftoff and Laser Patterning of Large Free-Standing GaN Substrates", Materials Research Society Symposium Proceedings, vol. 617, 2000, pp. J1.7.1-J1.7.12.

(Continued)

*Primary Examiner*—Calvin Lee
(74) *Attorney, Agent, or Firm*—Fitzpatrick, Cella, Harper & Scinto

(57) ABSTRACT

This invention provides a semiconductor film manufacturing method using a new separation technique and applications thereof. The semiconductor film manufacturing method of this invention includes a separation layer forming a step of hetero-epitaxially growing a separation layer (2) on a seed substrate (1), a semiconductor film forming step of forming a semiconductor film (3) on the separation layer (2), and a separation step of separating, by using the separation layer (2), the semiconductor film (3) from a composite member (Ia) formed in the semiconductor film forming step.

15 Claims, 6 Drawing Sheets

U.S. PATENT DOCUMENTS

| | | | |
|---|---|---|---|
| 5,856,229 A | 1/1999 | Sakaguchi et al. | 438/406 |
| 5,868,947 A | 2/1999 | Sakaguchi et al. | 216/2 |
| 5,970,361 A | 10/1999 | Kumomi et al. | 438/409 |
| 6,071,795 A | 6/2000 | Cheung et al. | 438/458 |
| 6,100,165 A * | 8/2000 | Sakaguchi et al. | 438/455 |
| 6,106,613 A | 8/2000 | Sato et al. | 117/54 |
| 6,140,209 A | 10/2000 | Iwane et al. | 438/458 |
| 6,143,628 A | 11/2000 | Sato et al. | 438/455 |
| 6,150,031 A | 11/2000 | Yonehara | 428/446 |
| 6,156,624 A | 12/2000 | Yamagata et al. | 438/459 |
| 6,190,937 B1 | 2/2001 | Nakagawa et al. | 438/67 |
| 6,211,038 B1 | 4/2001 | Nakagawa et al. | 438/409 |
| 6,258,698 B1 | 7/2001 | Iwasaki et al. | 438/455 |
| 6,294,478 B1 | 9/2001 | Sakaguchi et al. | 438/753 |
| 6,306,729 B1 | 10/2001 | Sakaguchi et al. | 438/458 |
| 6,331,208 B1 | 12/2001 | Nishida et al. | 117/89 |
| 6,342,433 B1 | 1/2002 | Ohmi et al. | 438/455 |
| 6,376,332 B1 | 4/2002 | Yanagita et al. | 438/458 |
| 6,382,292 B1 | 5/2002 | Ohmi et al. | 156/584 |
| 6,391,743 B1 | 5/2002 | Iwane et al. | 438/458 |
| 6,429,095 B1 | 8/2002 | Sakaguchi et al. | 438/458 |
| 6,452,091 B1 | 9/2002 | Nakagawa et al. | 136/261 |
| 6,468,923 B1 * | 10/2002 | Yonehara et al. | 438/761 |
| 6,475,323 B1 | 11/2002 | Ohmi et al. | 156/239 |
| 6,559,075 B1 | 5/2003 | Kelly et al. | 438/795 |
| 6,566,235 B2 | 5/2003 | Nishida et al. | 438/458 |
| 6,613,678 B1 | 9/2003 | Sakaguchi et al. | 438/695 |
| 6,639,327 B2 | 10/2003 | Momoi et al. | 257/913 |
| 6,677,183 B2 | 1/2004 | Sakaguchi et al. | 438/113 |
| 6,746,559 B2 | 6/2004 | Ohmi et al. | 156/239 |
| 6,756,289 B1 | 6/2004 | Nakagawa et al. | 438/478 |
| 6,867,110 B2 | 3/2005 | Yanagita et al. | 438/459 |
| 6,891,578 B2 | 5/2005 | Yonehara et al. | 349/43 |
| 6,972,215 B2 | 12/2005 | Sakaguchi et al. | 438/113 |
| 7,015,507 B2 | 3/2006 | Yonehara et al. | 257/65 |
| 7,029,950 B2 | 4/2006 | Yonehara et al. | 438/113 |
| 7,351,300 B2 | 4/2008 | Takayama et al. | |
| 2005/0124137 A1 | 6/2005 | Yonehara | 438/455 |
| 2005/0148122 A1 | 7/2005 | Yonehara | 438/149 |
| 2005/0217565 A1 * | 10/2005 | Lahreche et al. | 117/84 |
| 2006/0019466 A1 | 1/2006 | Nayfeh et al. | 438/458 |
| 2006/0124961 A1 | 6/2006 | Sakaguchi et al. | |
| 2006/0166468 A1 | 7/2006 | Yonehara et al. | 438/483 |

FOREIGN PATENT DOCUMENTS

| | | |
|---|---|---|
| JP | 2002-280531 | 9/2002 |
| JP | 2003-78117 | 3/2003 |
| JP | 3518455 | 2/2004 |
| JP | 2004-119807 | 4/2004 |
| TW | 558743 | 10/2003 |
| TW | I284360 | 7/2007 |

OTHER PUBLICATIONS

Daisuke Morita, et al., "High Output Power 365 nm Ultraviolet Light Emitting Diode of GaN-Free Structure", Japanese Journal of Applied Physics, vol. 41, Pt. 2, No. 12B, 2002, pp. L1434-L1436.

W. S. Wong, et al., "Fabrication of thin-film InGaN light-emitting diode membranes by laser lift-off", Applied Physics Letters, vol. 75, No. 10, Sep. 6, 1999, pp. 1360-1362.

Taiwanese Official Action dated Mar. 25, 2008 in Taiwanese Patent Application No. 094120284.0.

Hong Xiao, Introduction to Semiconductor Manufacturing Technology, Prentice Hall Inc., 2001, p. 603.

* cited by examiner

FIG. 6

REFLECTANCE OF METAL THIN FILM

| WAVELENGTH λ (μm) | Ag | Al | Au | Cd | Cu | Ni | Pt | Rh | Sn |
|---|---|---|---|---|---|---|---|---|---|
| UV REGION (0.28) | 25.2 | 92.3 | 37.8 | λ=0.251 36 | 33.0 | 37.6 | 43.1 | 68.5 | λ=0.251 17 |
| VIOLET (0.4) | 94.8 | 92.4 | 38.7 | λ=0.357 60 | 47.5 | λ=0.361 41.2 | λ=0.361 52.4 | 77.6 | λ=0.357 27 |
| RED (0.7) | 98.5 | 89.9 | 97.0 | · | 97.5 | 68.8 | 69.0 | 80.4 | · |
| INFRARED REGION (1.0) | 98.9 | 93.9 | 98.2 | · | 98.5 | 72.0 | 77.0 | 85.0 | · |

SEMICONDUCTOR FILM MANUFACTURING METHOD AND SUBSTRATE MANUFACTURING METHOD

This application is a 371 of PCT/JP05/11388, filed on Jun. 15, 2005, and titled "Semiconductor Film Manufacturing Method and Substrate Manufacturing Method," which claims priority under 35 U.S.C. § 119 to Japanese Application No. 2004-185237, filed on Jun. 23, 2004, the entire contents of which are hereby incorporated by reference.

TECHNICAL FIELD

The present invention relates to a semiconductor film manufacturing method using a separation step and applications thereof.

BACKGROUND ART

A method is described in patent references 1 to 3 and non-patent references 1 to 3, in which a GaN layer is epitaxially grown on an $Al_2O_3$ substrate, and the back surface of the $Al_2O_3$ substrate is irradiated with a pulse laser to decompose GaN near the interface between the $Al_2O_3$ substrate and the GaN layer, thereby separating the GaN layer from the $Al_2O_3$ substrate (this method will be referred to as a laser lift-off method hereinafter).

[Patent Reference 1] U.S. Pat. No. 6,559,075
[Patent Reference 2] U.S. Pat. No. 6,071,795
[Patent Reference 3] Japanese Patent No. 3518455
[Non-Patent Reference 1] O. Ambacher et al., Materials Research Society Symposium, Vol. 617 (2000), pp. J1.7.1-J1.7.12
[Non-Patent Reference 2] W. S. Wong et al., Applied Physics Letters, Vol. 75, No. 10, 6 Sep. 1999, pp. 1360-1362
[Non-Patent Reference 3] D. Morita et al., Japanese Journal of Applied Physics, Vol. 41 (2002), pp. L1434-L1436

In the laser lift-off method, when the GaN layer is separated by pulse laser irradiation, the $Al_2O_3$ substrate can crack due to the pressure of $N_2$ gas generated by decomposition of GaN. This can cause damage such as microcracks to the GaN layer. The microcracks cause degradation in characteristic or a decrease in yield of devices formed later in the damaged GaN layer.

In the laser lift-off method, separation takes a long time because the whole surface of the substrate must be scanned by the pulse laser.

In the laser lift-off method, a three-dimensional pattern as a trace of pulse laser scanning is generated on the separated surface of the GaN layer. To remove this three-dimensional pattern, an additional step such as polishing is necessary. This makes the operation cumbersome. In addition, the increase in number of manufacturing steps can lead to a decrease in yield.

In the laser lift-off method, the substrate used to grow a semiconductor film is limited to a transparent substrate such as an $Al_2O_3$ substrate that passes a laser beam. It is hence difficult to apply a nontransparent substrate such as an SiC substrate, GaAs substrate, or Ge substrate.

As described above, to introduce the substrate separation method by the laser lift-off method to mass production of semiconductor devices, still more technological development to, e.g., increase the yield has been demanded.

DISCLOSURE OF INVENTION

The present invention has been made in consideration of the above-described problems, and has as its object to provide a semiconductor film manufacturing method using a new separation technique and applications thereof.

According to the first aspect of the present invention, there is provided a method of manufacturing a semiconductor film separated from a seed substrate, comprising a separation layer forming step of hetero-epitaxially growing a separation layer on the seed substrate, a semiconductor film forming step of forming a semiconductor film on the separation layer, and a separation step of separating, by using the separation layer, the semiconductor film from a composite member formed in the semiconductor film forming step.

According to the preferred embodiment of the present invention, in the separation layer forming step, a layer configured to generate a strain energy in the separation layer, and/or an interface between the separation layer and the semiconductor film, and/or the interface between the separation layer and the seed substrate is preferably formed as the separation layer.

According to the preferred embodiment of the present invention, in the separation layer forming step, the separation layer is preferably formed by using a material having a lattice constant and/or thermal expansion coefficient different from the seed substrate.

According to the preferred embodiment of the present invention, in the separation step, the semiconductor film is preferably separated from the composite member by applying a force to the composite member.

According to the preferred embodiment of the present invention, the seed substrate preferably has a single-crystal structure.

According to the preferred embodiment of the present invention, in the separation layer forming step, a separation layer having a crystal structure is preferably formed.

According to the preferred embodiment of the present invention, in the separation layer forming step, a separation layer having a microcrystal structure is preferably formed.

According to the preferred embodiment of the present invention, in the semiconductor film forming step, a semiconductor film having a single-crystal structure is preferably formed.

According to the preferred embodiment of the present invention, in the separation step, preferably, a crack spreading in a planar direction of the seed substrate is generated in the separation layer, and/or an interface between the separation layer and the semiconductor film, and/or the interface between the separation layer and the seed substrate to separate the semiconductor film from the composite member.

According to the preferred embodiment of the present invention, the seed substrate is preferably made of a materiel selected from the group consisting of $Al_2O_3$, SiC, GaAs, InP, Ge, and Si.

According to the preferred embodiment of the present invention, in the separation layer forming step, a separation layer made of a compound semiconductor is preferably formed.

According to the preferred embodiment of the present invention, in the separation layer forming step, a separation layer made of a material selected from the group consisting of GaN, InGaN, AlGaN, AlN, AlAs, AlGaAs, InGaAs, InAlAs, InGaAlP, InGaAsP, and InGaP is preferably formed.

According to the preferred embodiment of the present invention, in the semiconductor film forming step, a semiconductor film made of a material selected from the group consisting of GaN, GaAs, InP, AlGaAs, InGaN, AlGaN, AlN, AlAs, InGaAs, InAlAs, InGaAlP, InGaAsP, and InGaP is preferably formed.

According to the preferred embodiment of the present invention, the semiconductor film forming step, the semiconductor film is preferably formed by epitaxial growth.

According to the preferred embodiment of the present invention, preferably, the seed substrate is made of one of $Al_2O_3$ and SiC, and the separation layer is made of a material selected from the group consisting of GaN, InGaN, AlGaN, and AlN.

According to the preferred embodiment of the present invention, preferably, the seed substrate is made of a material selected from the group consisting of GaAs, InP, and Ge, and the separation layer is made of a material selected from the group consisting of AlGaAs, InGaAs, InAlAs, InGaAlP, InGaAsP, and InGaP.

According to the preferred embodiment of the present invention, the manufacturing method preferably further comprises a step of forming, between the seed substrate and the separation layer, a separation assisting layer by using a material to be selectively etched with respect to the substrate and the separation layer.

According to the preferred embodiment of the present invention, the manufacturing method preferably further comprises a step of forming a separation assisting layer between the seed substrate and the separation layer, the separation assisting layer containing Al in a larger amount than layers in contact with the separation assisting layer.

According to the preferred embodiment of the present invention, the manufacturing method preferably further comprises a step of forming a separation assisting layer between the seed substrate and the separation layer, the separation assisting layer being made of a material which satisfies $Al_xGa_{1-x}As$ (x>0.95).

According to the preferred embodiment of the present invention, the manufacturing method preferably further comprises, before the separation step, a step of etching a periphery of the separation assisting layer.

According to the preferred embodiment of the present invention, in the separation step, a fluid is preferably blown to or near the separation layer on a side surface of the composite member.

According to the preferred embodiment of the present invention, preferably, the manufacturing method further comprises, after the semiconductor film forming step before the separation step, a bonding step of bonding the seed substrate with the separation layer and the semiconductor film to a handle substrate while setting the separation layer inside, and in the separation step, the semiconductor film is separated, together with the handle substrate by using the separation layer, from the composite member formed in the bonding step.

According to the preferred embodiment of the present invention, the manufacturing method preferably further comprises a step of forming a semiconductor device on the semiconductor film.

According to the preferred embodiment of the present invention, the device forming step can be executed either before the bonding step or after the separation step.

According to the preferred embodiment of the present invention, preferably, the seed substrate remaining after the separate step is recycled, i.e., another semiconductor film is manufactured by further executing the separation layer forming step and subsequent steps by using the seed substrate remaining after the separation step as a raw material.

According to the second aspect of the present invention, there is provided a method of manufacturing a substrate having a semiconductor film, characterized by comprising a separation layer forming step of hetero-epitaxially growing a separation layer on a seed substrate, a semiconductor film forming step of forming a semiconductor film on the separation layer, a bonding step of bonding the seed substrate with the separation layer and the semiconductor film to a handle substrate while setting the separation layer inside, and a separation step of separating the semiconductor film, together with the handle substrate by using the separation layer, from a composite member formed in the bonding step to obtain a substrate having the semiconductor film on the handle substrate.

According to the preferred embodiment of the present invention, the manufacturing method can further comprise a device forming step of forming a semiconductor device in the semiconductor film. The device forming step can be executed either before the bonding step or after the separation step.

The semiconductor device can include, e.g., a light-emitting diode or a laser.

According to the present invention, a semiconductor film manufacturing method using a new separation technique and applications thereof can be provided. According to the present invention, for example, a rarely damaged semiconductor film or a substrate having the semiconductor film can be manufactured, and/or the yield can be increased, and/or the throughput can be increased, and/or the degree of freedom in handle substrate selection can be increased.

Other features and advantages of the present invention will be apparent from the following description taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 6 is a table showing the reflectances of metal thin films.

BEST MODE FOR CARRYING OUT THE INVENTION

The preferred embodiments of the present invention will be described below in detail with reference to the accompanying drawings.

First Embodiment

Separation Method

As the first embodiment of the present invention, a method of separating a semiconductor film from a substrate or a method of manufacturing a semiconductor film separated from a substrate will be described below. FIGS. 1A to 1D are views schematically showing a method of separating a semiconductor film from a substrate or method of manufacturing a semiconductor film separated from a substrate.

Figure 1A:
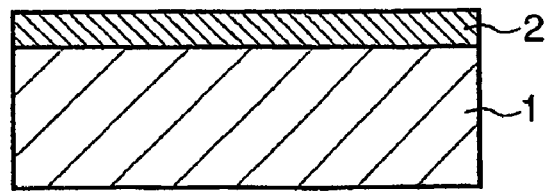
FIGS. 1A to 1D are views schematically showing a method of separating a semiconductor film from a substrate.

In the separation layer forming step shown in FIG. 1A, on a seed substrate 1 such as a Ge substrate having crystallinity, a semiconductor film having a lattice constant different from the seed substrate 1, and for example, a separation layer 2 made of AlAs or InGaAs is hetero-epitaxially grown.

Figure 1B:
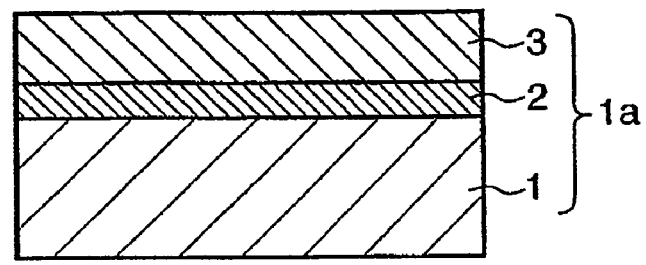

In the semiconductor film forming step shown in FIG. 1B, a semiconductor film 3 made of GaAs is formed on the separation layer 2 to form a composite member 1a including the substrate 1, separation layer 2, and semiconductor film 3. At this time, a semiconductor device can be formed in the semiconductor film 3.

Figure 1C:
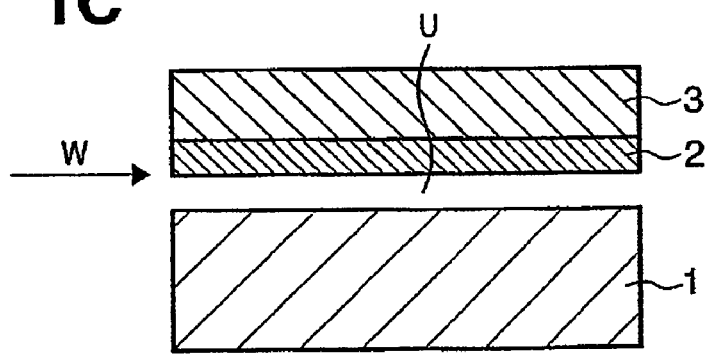

In the separation step shown in FIG. 1C, the semiconductor film 3 is separated from the composite member 1a by using the separation layer 2. The semiconductor film 3 can be separated by, e.g., forming a crack spreading in the planar direction of the composite member 1a in the separation layer 2, and/or the interface between the separation layer 2 and the semiconductor film 3, and/or the interface between the separation layer 2 and the substrate 1. FIG. 1C schematically shows a state in which the semiconductor film 3 is separated from the composite member 1a by forming a crack c along the planar direction of the composite member 1a in the interface between the separation layer 2 and the substrate 1.

For example, the separation layer 2 made of InGaAs having a lattice constant and/or thermal expansion coefficient different from the substrate 1 is hetero-epitaxially grown on the seed substrate 1 such as a Ge substrate having crystallinity. The semiconductor film 3 made of GaAs is formed on the separation layer 2. In this case, a strain energy caused by mismatch between the lattice constants and/or thermal expansion coefficients can intensively be generated in the separation layer 2, and/or the interface between the separation layer 2 and the semiconductor film 3, and/or the interface between the separation layer 2 and the substrate 1. After that, an external force (separation inducing force) to induce separation is applied to the whole or part (e.g., in the separation layer 2, and/or the interface between the separation layer 2 and the semiconductor film 3, and/or the interface between the separation layer 2 and the substrate 1) of the composite member (composite substrate) 1a. The semiconductor film 3 can be separated from the composite member 1a by using the strain energy generated in the composite member 1a. When the separation inducing force is applied to the whole or part of the composite member 1a, a crack can selectively be formed in a portion which has the strain energy two-dimensionally distributed along the planar direction of the composite member 1a (or semiconductor film 3, separation layer 2, and seed substrate 1). The separation inducing force need not always continuously be applied until the semiconductor film 3 is completely separated from the composite member 1a. Once a crack is partially formed in the composite member 1a, a new strain energy is generated by the partial crack even when the external force application is stopped. With the strain energy, the crack can spread in a self-prompting manner to completely separate the semiconductor film 3 from the composite member.

The separation layer 2 is provided between the seed substrate 1 and the semiconductor film 3 to be separated from the seed substrate 1. With this structure, the semiconductor film 3 can be separated from the substrate 1 by forming the crack only in the separation layer 2, and/or the interface between the separation layer 2 and the semiconductor film 3, and/or the interface between the separation layer 2 and the substrate 1 without greatly damaging the semiconductor film 3.

The seed substrate 1 is preferably made of a material having a single-crystal structure. In addition to the Ge substrate, a substrate made of, e.g., $Al_2O_3$, SiC, GaAs, InP, or Si is preferable.

The separation layer 2 should be made of a material having a lattice constant and/or thermal expansion coefficient different from the seed substrate 1. In addition to InGaAs, a compound semiconductor material such as GaN, InGaN, AlGaN, AlN, AlAs, AlGaAs, InAlAs, InGaAlP, InGaAsP, or InGaP is preferable.

For the semiconductor film 3, in addition to GaAs, a compound semiconductor material such as GaN, AlGaAs, InP, InGaN, AlGaN, AlN, AlAs, InGaAs, InAlAs, InGaAlP, InGaAsP, or InGaP is preferably used.

In the separation step of separating the semiconductor film from the composite member, preferably, a fluid W is blown to or near the separation layer 2 and injected into the separation layer 2, and/or the interface between the separation layer 2 and the semiconductor film 3, and/or the interface between the separation layer 2 and the substrate 1 to form a crack in the injected portion of the composite member 1a, thereby separating the semiconductor film.

The AlAs epitaxial growth layer as an example of the separation layer has $10^7$ times higher selective etching characteristics than the GaAs layer as an example of the semiconductor film. When the fluid introduced portion is formed by using the characteristics, the separation start position can more reliably be limited to the separation layer or its interface.

According to the separation method by injecting the fluid W, a crack can be formed in the separation layer 2, and/or the interface between the separation layer 2 and the semiconductor film 3, and/or the interface between the separation layer 2 and the substrate 1 by the energy of injection of the fluid W and the strain energy which is generated in the separation layer 2, and/or the interface between the separation layer 2 and the semiconductor film 3, and/or the interface between the separation layer 2 and the substrate 1 due to mismatch between the lattice constants and/or thermal expansion coefficients. The crack can be spread in the planar direction.

Figure 1D:
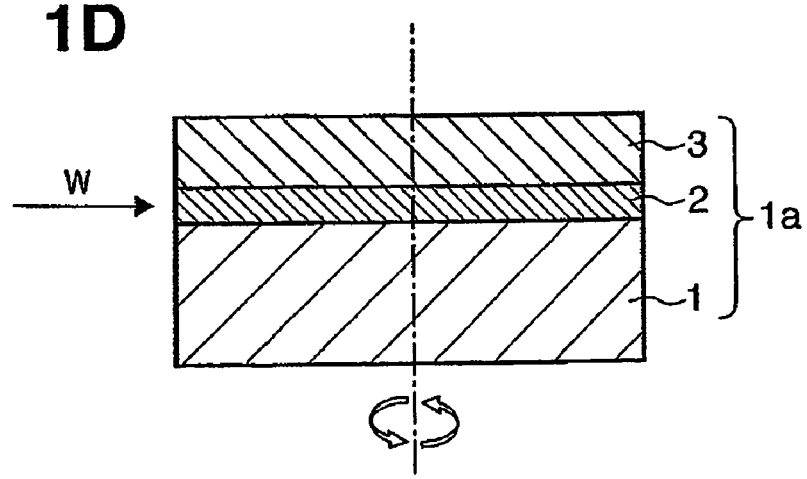

In the semiconductor film separation step, as shown in FIG. 1D, the fluid W is blown to or near the separation layer 2 while the composite member 1a is rotated about an axis almost perpendicular to the planar direction. In this case, separation can progress spirally from the periphery to center of the substrate 1.

As the fluid, a gas such as air, inert gas, or etching gas can be used as well as a liquid such as water. Instead of blowing the fluid to or near the separation layer 2 of the composite member, the composite member may be placed in a chamber and applied a pressure by a fluid.

According to the method of the above-described preferred embodiment of the present invention, damage to the semiconductor film 3 and seed substrate 1 in separation largely decreases as compared to the laser lift-off method. Hence, a semiconductor device having good characteristics can be formed on the semiconductor film 3.

According to the method of the preferred embodiment of the present invention, after the semiconductor film 3 is separated, the seed substrate 1 can be recycled as a raw material. That is, when the separation layer forming step, semiconductor film forming step, and separation step are repeatedly executed a plurality of number of times by using the seed substrate 1 after separation as a raw material, the semiconductor substrate manufacturing cost can largely be reduced.

According to the method of the preferred embodiment of the present invention, not only a transparent substrate but also a nontransparent substrate can be used as the seed substrate 1.

Second Embodiment

Substrate Manufacturing Method

As the second embodiment of the present invention, a method of manufacturing a substrate having a semiconductor film will be described below. FIGS. 2A to 2D are views schematically showing a method of manufacturing a substrate having a semiconductor film.

Figure 2A:
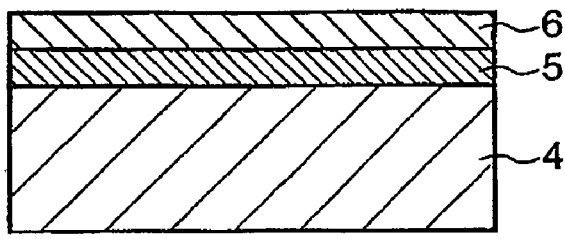
FIGS. 2A to 2D are views schematically showing a method of manufacturing a substrate having a semiconductor film.

In the step shown in FIG. 2A (separation layer forming step and semiconductor film forming step), on a first substrate (seed substrate) 4 such as a Ge substrate having crystallinity, a semiconductor film having a lattice constant different from the first substrate 4, and for example, a separation layer 5 made of InGaAs is hetero-epitaxially grown. A semiconductor film 6 made of GaAs is formed on the separation layer 5.

Figure 2B:
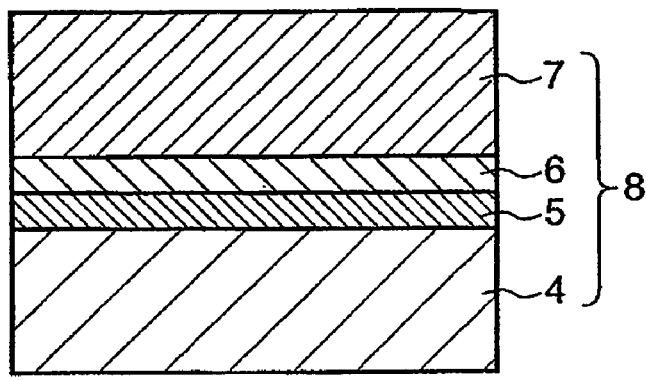

In the bonding step shown in FIG. 2B, the first substrate 4 is bonded to a second substrate (handle substrate) 7 such as an Si substrate while setting the semiconductor film 6 inside to form a composite member composite substrate) 8. In this bonding, when a metal film is formed on each bonding interface, and the metal surfaces are bonded to each other, limitations on the pressure and temperature necessary for bonding can be relaxed. The metal layer can suitably be used as a bonding material and also serves as a light reflecting layer which contributes to improvement of device performance.

Figure 2C:
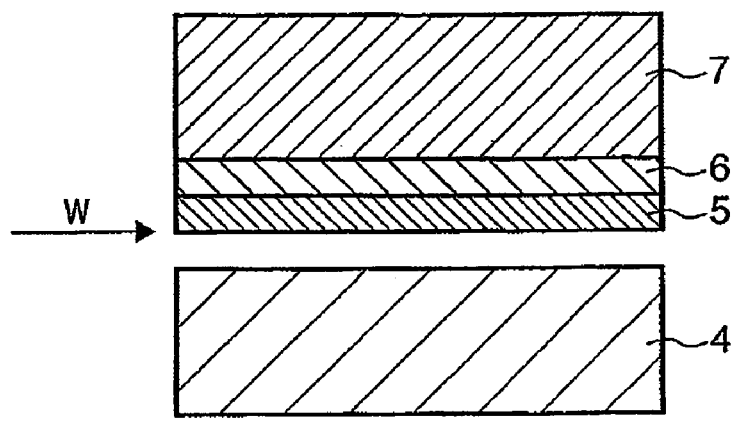
Figure 2D:
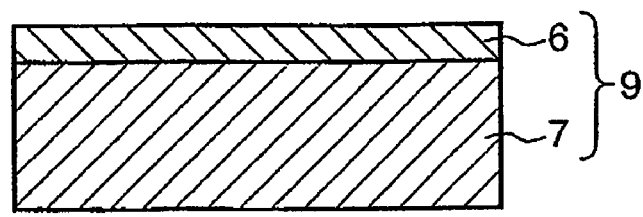

In the separation step shown in FIG. 2C, a crack spreading in the planar direction is formed in the separation layer 5, and/or the interface between the separation layer 5 and the semiconductor film 6, and/or the interface between the separation layer 5 and the first substrate 4 of the composite member 8 to separate the semiconductor film 6 and second substrate 7 from the composite member 8. With the above step, the semiconductor film 6 is transferred from the first substrate 4 to the second substrate 7. A substrate 9 having the semiconductor film 6 on the second substrate 7 is obtained, as shown in FIG. 2D. The method described in, e.g., the first embodiment can be applied to this separation.

For example, the separation layer 5 made of InGaAs having a lattice constant and/or thermal expansion coefficient different from the first substrate 4 is hetero-epitaxially grown on the first substrate (seed substrate) 4 such as a Ge substrate having crystallinity. The semiconductor film 6 made of GaAs is formed on the separation layer 5. The first substrate 4 is bonded to the second substrate (handle substrate) 7 made of Si while setting the semiconductor film 6 inside to form the composite member 8. A strain energy caused by mismatch between the lattice constants and/or thermal expansion coefficients can intensively be generated in the separation layer 5, and/or the interface between the separation layer 5 and the semiconductor film 6, and/or the interface between the separation layer 5 and the first substrate 4. After that, a separation inducing force is applied to the whole or part (e.g., in the separation layer 5, and/or the interface between the separation layer 5 and the semiconductor film 6, and/or the interface between the separation layer 5 and the first substrate 4) of the composite member 8. The semiconductor film 6 and second substrate 7 can be separated from the composite member 8 by using the strain energy generated in the composite member 8.

The first substrate (seed substrate) 4 is preferably made of a material having a single-crystal structure. In addition to the Ge substrate, a substrate made of, e.g., $Al_2O_3$, SiC, GaAs, InP, or Si is preferable.

The separation layer 5 should be made of a material having a lattice constant and/or thermal expansion coefficient different from the first substrate 4. In addition to InGaAs, a compound semiconductor material such as GaN, InGaN, AlGaN, AlN, AlAs, AlGaAs, InAlAs, InGaAlP, InGaAsP, or InGaP is preferable.

For the semiconductor film 6, in addition to GaAs, a compound semiconductor material such as GaN, AlGaAs, InP, InGaN, AlGaN, AlN, AlAs, InGaAs, InAlAs, InGaAlP, InGaAsP, or InGaP is preferably used.

As the second substrate 7, in addition to the semiconductor substrate of Si, a metal substrate made of Al, Cu, or Cu—W, an insulating substrate made of glass, or a flexible substrate made of plastic is preferable.

In the step of separating the semiconductor film and second substrate from the composite member, preferably, a fluid (liquid or gas) W is blown to or near the separation layer 5 and injected into the separation layer 5, and/or the interface between the separation layer 5 and the semiconductor film 6, and/or the interface between the separation layer 5 and the first substrate 4 to form a crack in the injected portion of the composite member, thereby separating the semiconductor film.

Third Embodiment

Semiconductor Device Manufacturing Method

As the third embodiment of the present invention, a method of manufacturing a semiconductor film having a semiconductor device or a substrate will be described below. FIGS. 3A to 3E are views schematically showing a method of manufacturing a semiconductor film having a semiconductor device or a substrate.

Figure 3A:
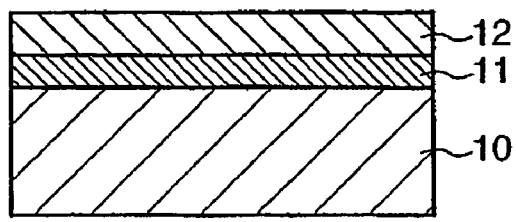
FIGS. 3A to 3E are views schematically showing a method of manufacturing a semiconductor film having a semiconductor device or a substrate.

In the step shown in FIG. 3A (separation layer forming step and semiconductor film forming step), on a first substrate (seed substrate) 10 such as a Ge substrate having crystallinity, a semiconductor film having a lattice constant different from the first substrate 10, and for example, a separation layer 11 made of InGaAs is hetero-epitaxially grown. A semiconductor film 12 made of GaAs is formed on the separation layer 11.

Figure 3B:
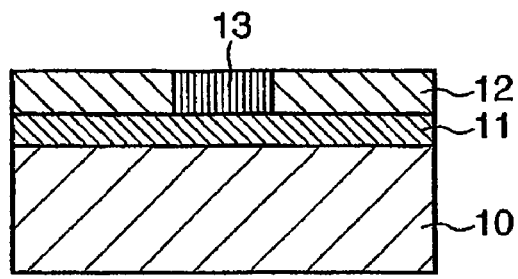

In the semiconductor device forming step shown in FIG. 3B, a semiconductor device 13 such as an LED is formed in the semiconductor film 12. Typically, in the semiconductor device forming step, instead of forming a single semiconductor device, a semiconductor circuit including a plurality of semiconductor devices and interconnections to connect them can be formed.

Figure 3C:
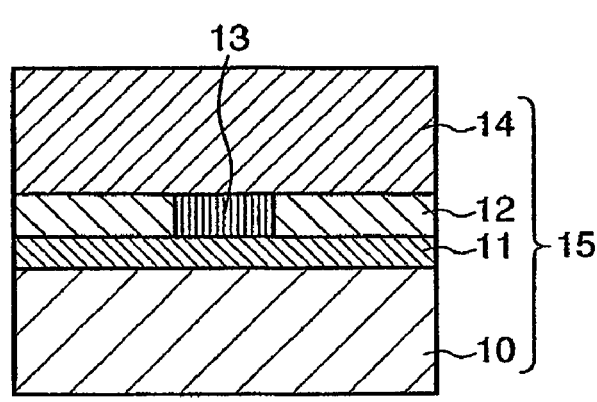

In the bonding step shown in FIG. 3C, the first substrate 10 is bonded to a second substrate (handle substrate) 14 such as an Si substrate while setting the semiconductor film 12 inside to form a composite member (composite substrate) 15.

Figure 3D:
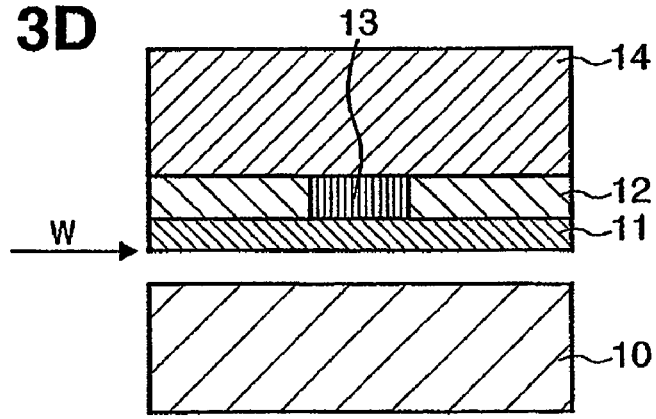
Figure 3E:
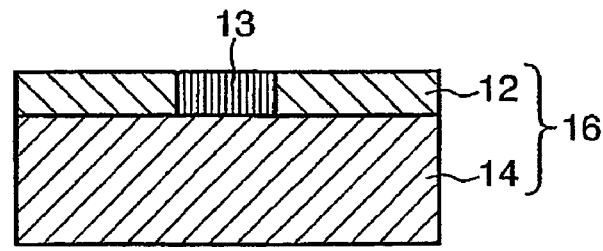

In the separation step shown in FIG. 3D, a crack spreading in the planar direction is formed in the separation layer 11, and/or the interface between the separation layer 11 and the semiconductor film 12, and/or the interface between the separation layer 11 and the first substrate 10 of the composite member 15 to separate the semiconductor film 12 having the semiconductor device 13 and the second substrate 14 from the composite member 15. With the above step, the semiconductor film 12 having the semiconductor device 13 is transferred from the first substrate (seed substrate) 10 to the second substrate (handle substrate) 14. A substrate (or semiconductor device) 9 having, on the second substrate 14, the semiconductor film 12 with the semiconductor device 13 formed on it is obtained, as shown in FIG. 3E. The method described in, e.g., the first embodiment can be applied to this separation.

After the semiconductor device 13 is formed in the semiconductor film 12, the first substrate 10 is bonded to the second substrate 14. Alternatively, after the semiconductor film 12 is transferred from the first substrate 10 to the second substrate 14 by separation, the semiconductor device 13 may be formed on the transferred semiconductor film 12.

For example, the separation layer 11 made of InGaAs having a lattice constant and/or thermal expansion coefficient different from the first substrate 10 is hetero-epitaxially grown on the first substrate (seed substrate) 10 such as a Ge substrate having crystallinity. The semiconductor film 12 made of GaAs is formed on the separation layer 11. The semiconductor device 13 such as an LED is formed in the semiconductor film 12. The first substrate (seed substrate) 10 is bonded to the second substrate (handle substrate) 14 made of Si while setting the semiconductor film 12 inside to form the composite member 15. A strain energy caused by mismatch between the lattice constants and/or thermal expansion coefficients can intensively be generated in the separation layer 11, and/or the interface between the separation layer 11 and the semiconductor film 12, and/or the interface between the separation layer 11 and the first substrate 10. After that, a separation inducing force is applied to the whole or part (e.g., in the separation layer 11, and/or the interface between the separation layer 11 and the semiconductor film 12, and/or the interface between the separation layer 11 and the first substrate 10) of the composite member 15. The semiconductor film 12 and second substrate 14 can be separated from the composite member 15 by using the strain energy generated in the composite member 15.

The first substrate (seed substrate) 10 is preferably made of a material having a single-crystal structure. In addition to the Ge substrate, a substrate made of, e.g., $Al_2O_3$, SiC, GaAs, InP, or Si is preferable.

The separation layer 11 should be made of a material having a lattice constant and/or thermal expansion coefficient different from the first substrate 10. In addition to InGaAs, a compound semiconductor material such as GaN, InGaN, AlGaN, AlN, AlAs, AlGaAs, InAlAs, InGaAlP, InGaAsP, or InGaP is preferable.

For the semiconductor film 12, in addition to GaAs, a compound semiconductor material such as GaN, AlGaAs, InP, InGaN, AlGaN, AlN, AlAs, InGaAs, InAlAs, InGaAlP, InGaAsP, or InGaP is preferably used.

As the semiconductor device 13, a light-emitting device such as an LED (Light-Emitting Diode) or laser, a light-receiving device to detect radiation such as X-rays, a photoelectric conversion device such as a solar cell, or a device such as a transistor, diode, or capacitor is preferable. The forming step (FIG. 3B) of the semiconductor device 13 preferably includes a step of forming an insulating layer to cover the semiconductor device and a step of planarizing the insulating layer.

As the second substrate (handle substrate) 14, in addition to the semiconductor substrate of Si, a metal substrate made of Al or Cu, an insulating substrate made of glass, or a flexible substrate made of plastic is preferable.

Preferably, a driving circuit to drive the semiconductor device 13 is formed on the second substrate 14, and/or the second substrate 14 is a printed circuit board on which a circuit pattern is formed. In this case, the connection electrode of the circuit including the semiconductor device 13 is electrically connected to the connection electrode of the driving circuit of the second substrate or the connection electrode of the printed circuit board.

In the step of separating the semiconductor film and second substrate from the composite member, preferably, a fluid (liquid or gas) W is blown to or near the separation layer 11 and injected into the separation layer 11, and/or the interface between the separation layer 11 and the semiconductor film 12, and/or the interface between the separation layer 11 and the first substrate 10 to form a crack in the injected portion of the composite member, thereby separating the semiconductor film.

EXAMPLES

Detailed examples of the present invention will be described below. The present invention is not limited to these examples.

Example 1

An InGaAs layer 2 (thickness: 10 nm) is hetero-epitaxially grown on a Ge substrate (seed substrate) 1 by MOCVD (FIG. 1A). A GaAs layer 3 (thickness: 200 µm) is epitaxially grown on the InGaAs layer 2 to form a composite member 1a (FIG. 1B).

A separation inducing force is applied from the side surface of the composite member 1a to the InGaAs layer 2. More specifically, a so-called water jet W to blow pure water pressurized to several MPa to 100 MPa from a thin nozzle with a diameter of 0.1 mm is blown to or near the side surface of the InGaAs layer 2. With this process, a crack spreading in the planar direction is formed in the InGaAs layer 2, and/or the interface between the InGaAs layer 2 and the GaAs layer 3, and/or the interface between the InGaAs layer 2 and the Ge substrate 1 so that the GaAs layer 3 can be separated from the composite member 1a (Ge substrate 1) (FIG. 1C).

The separated Ge substrate can repeatedly be used by executing a planarization process such as polishing or etching for its surface as needed.

Example 2

An InGaAs layer 5 (thickness: 10 nm) is hetero-epitaxially grown on a Ge substrate (seed substrate) 4 by MOCVD. A GaAs layer 6 (thickness: 3 µm) is epitaxially grown on the InGaAs layer 5 (FIG. 2A).

The Ge substrate 4 is bonded to an Si substrate (handle substrate) 7 while setting the GaAs layer 6 inside to form a composite member 8 (FIG. 2B). Before bonding, a Cr film (thickness: 10 nm) and Au film (thickness: 200 nm) (neither are shown) are sequentially formed on each of the surfaces of the GaAs layer 6 and Si substrate 7. When the Au films on the surfaces are brought into tight contact with each other and heated under pressure, the composite member 8 having a sufficient bonding strength can be obtained.

A separation inducing force is applied from the side surface of the composite member 8 to the InGaAs layer 5. More specifically, a so-called water jet W to blow pure water pressurized to several MPa to 100 MPa from a thin nozzle with a diameter of 0.1 mm is blown to or near the side surface of the InGaAs layer 5. With this process, a crack spreading in the planar direction is formed in the InGaAs layer 5, and/or the interface between the InGaAs layer 5 and the GaAs layer 6, and/or the interface between the InGaAs layer 5 and the Ge substrate 4 so that the GaAs layer 6 can be separated from the composite member 8 (Ge substrate 4) 1a (FIG. 2C).

With this process, a semiconductor substrate 9 having the GaAs layer 6 on the metal layer (not shown) on the Si substrate 7 is obtained.

The separated Ge substrate can be recycled. When a planarization process such as polishing or etching is executed for the surface of the separated Ge substrate as needed, the Ge substrate can repeatedly be used.

In this example, the separation layer having the strain energy is formed from the single InGaAs layer. The separation layer can also be formed from a plurality of layers having different In compositions.

For example, an InGaAs layer having a composition ratio higher than 1% has a lattice constant larger than a Ge substrate. To the contrary, an InGaAs layer having a composition ratio equal to or lower than 1% has a lattice constant smaller than a Ge substrate and can therefore have both tensile strain and compression strain. Even when a composition material such as InGaP or InGaAsP is used in place of InGaAs, the component and magnitude of strain can be controlled.

The GaAs layer and Si substrate are bonded through the Au films. However, the GaAs layer and Si substrate can also be bonded directly by executing sputter cleaning on their surfaces in a vacuum state, bringing them into tight contact, and applying pressure.

Example 3

In this example, a method using a separation assisting layer to further facilitate separation will be described.

Figure 4A:
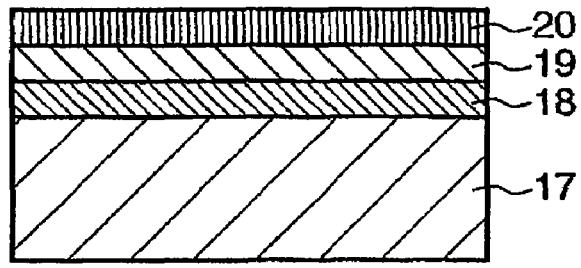
FIGS. 4A to 4D are views schematically showing a method of manufacturing a substrate (or semiconductor device) including a step of separating a semiconductor film by using a separation assisting layer.

An AlAs layer 18 (thickness: 50 nm), InGaAs layer 19 (In composition: 0.2, thickness: 10 nm), and GaAs layer 20 (thickness: 3 μm) are continuously epitaxially grown on a Ge substrate (seed substrate) 17 by MOCVD (FIG. 4A). The AlAs layer 18 functions as a separation assisting layer. The InGaAs layer 19 functions as a separation layer.

Figure 4B:
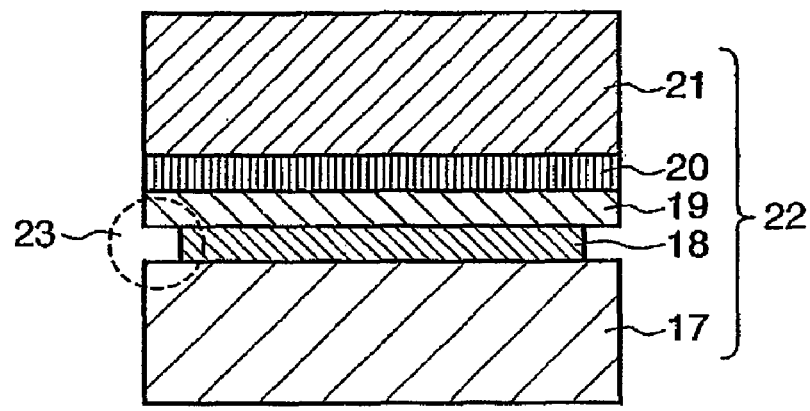

The Ge substrate 17 is bonded to an Si substrate 21 while setting the GaAs layer 20 inside to form a composite member 22 (FIG. 4B). Before bonding, a Cr film (thickness: 10 nm) and Au film (thickness: 200 nm) (neither are shown) are sequentially formed on each of the surfaces of the GaAs layer 20 and Si substrate 21. When the Au films on the surfaces are brought into tight contact with each other and heated under pressure, the composite member 22 having a sufficient bonding strength can be obtained.

Next, the composite member 22 is dipped in an SPM solution (etching solution) to partially remove the GaAs layer 20 and InGaAs layer 19 to expose the side surface of the AlAs layer 18 at the periphery of the composite member 22. The periphery of the AlAs layer 18 is selectively removed by etching using an FPM solution (etching solution) to form a recessed portion 23 at the periphery of the composite member 22. The recessed portion 23 can function to guide a fluid injected for separation to the AlAs layer 18 or its interface and concentrate the force for separation to the AlAs layer 18 or its interface. Etching of AlAs progresses at a speed much higher than GaAs and InGaAs. In addition, the oxide of AlAs oxidized by water is water-soluble. For these reasons, during separation by a water jet W, a region where the AlAs layer 18 at the periphery of the composite member 22 is selectively etched is formed. Furthermore, a dissolving function in pure water of the water jet W can also be expected.

Figure 4C:
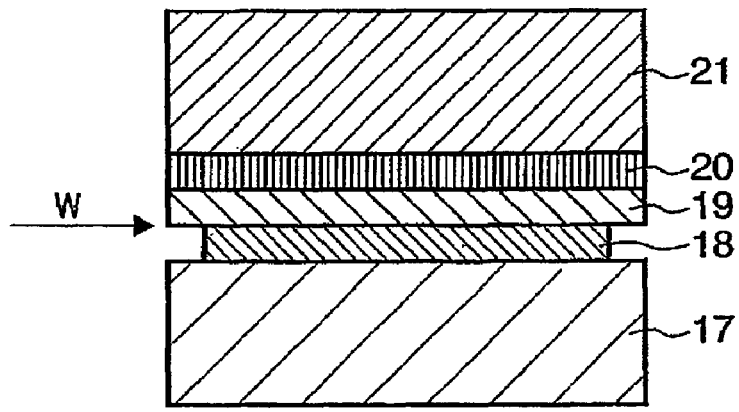
Figure 4D:
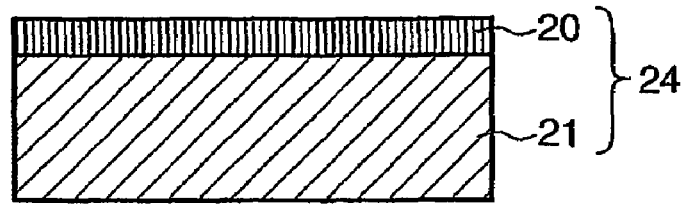

The so-called water jet W to blow pure water pressurized to several MPa to 100 MPa from a thin nozzle with a diameter of 0.1 mm is blown to or near the recessed portion 23 of the composite member 22. Since the force (force to separate portions split into two substrates) of the water jet W to split the composite member 22 into two substrates concentrates to the recessed portion 23, the composite member 22 is split into two substrates as the accumulated strain energy is released (FIG. 4C).

With the above process, a semiconductor substrate 24 which has, on the Si substrate 21, the GaAs layer 20 on the metal layers (not shown) made of Au and Cu can be obtained.

In this example, a pair of separation layer and separation assisting layer is formed. For example, a plurality of pairs of separation layers and separation assisting layers may be formed. Layers each containing different In compositions may be formed as the separation layer and separation assisting layer.

The composition of the separation assisting layer is preferably determined such that it contains a larger amount of Al than the upper and lower layers in contact with it. The separation assisting layer is preferably made of a material represented by, e.g., $Al_xGa_{1-x}As$ (x>0.95) in addition to AlAs.

Example 4

In this example, the separation layer has a layered structure including layers having lattice constants larger and smaller than the substrate.

An InGaP layer (thickness: 5 nm) having a lattice constant smaller than Ge and an In composition of 0.28, an InGaAs layer (thickness: 5 nm) having a lattice constant larger than Ge and an In composition of 0.2, and a GaAs layer (thickness: 3 μm) are continuously epitaxially grown on a Ge substrate by MOCVD.

With this structure, a large strain energy is intensively present in the interface between the InGaP layer and the InGaAs layer. The lattice constants are averaged in the entire separation layer having the layered structure of the InGaP layer and InGaAs layer. For this reason, the lattice constant differences at the interfaces between the Ge substrate and the InGaP layer and between the InGaAs layer and the GaAs layer are relaxed. Hence, a GaAs layer having satisfactory crystallinity can be obtained.

Then, an Si substrate is bonded to the Ge substrate, and separation is executed, as in Example 3.

Example 5

Figure 5A:
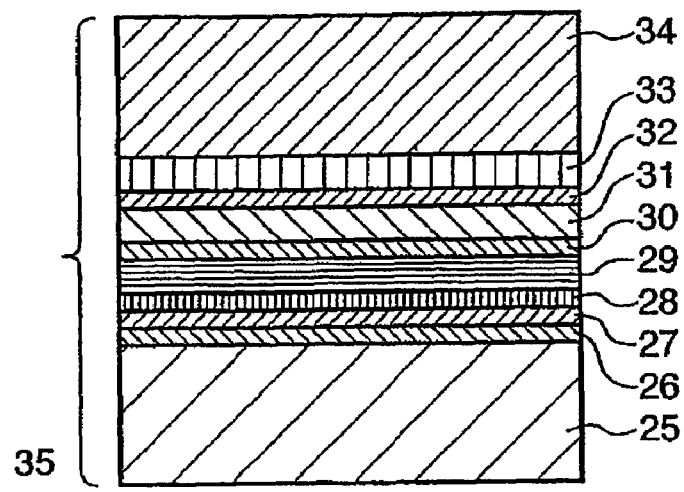
FIGS. 5A to 5C are views schematically showing a method of manufacturing a substrate (or semiconductor device) including a step of separating a semiconductor film by using a separation assisting layer.
Figure 5B:
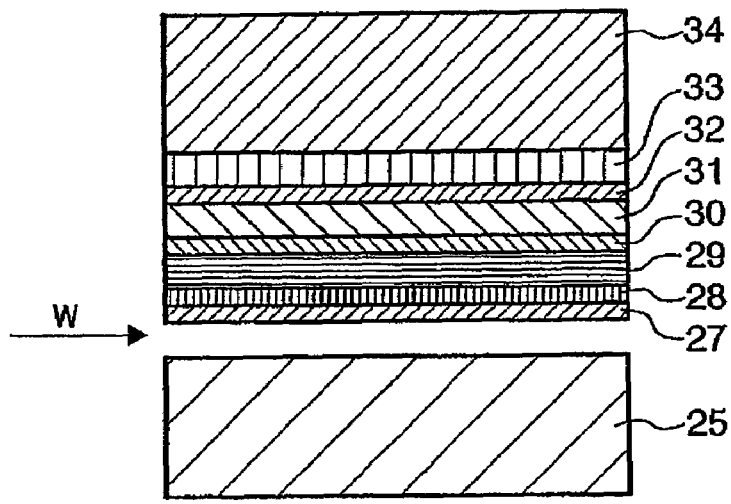
Figure 5C:
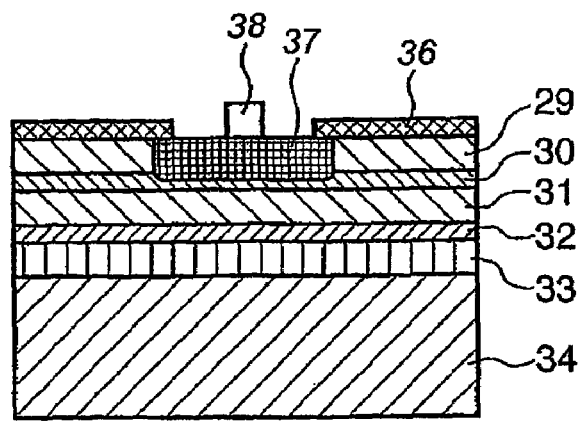

As shown in FIGS. 5A to 5C, a separation assisting layer including an AlAs layer 26 and a separation layer including an InGaAs layer 27 are formed on a Ge substrate 25. An n-type GaAs layer 28, n-type $Al_xGa_{1-x}As$ layer 29, n-type $Al_yGa_{1-y}As$ layer 30, n-type $Al_xGa_{1-x}As$ layer 31, and n-type GaAs layer 32 (y<x) are sequentially epitaxially grown on the surface of the resultant structure (FIG. 5A).

The impurity concentration and thickness of each epitaxial growth layer depends on the design of the device. Typical structures are as follows.

n-type GaAs layer 28: 0.05 to 0.5 μm; Si doping
n-type $Al_{0.35}Ga_{0.65}As$ layer 29: 1 μm; Si doping
n-type $Al_{0.13}Ga_{0.87}$ layer 30: 0.5 μm; Si doping
n-type $Al_{0.35}Ga_{0.65}As$ layer 31: 1 μm; Si doping
n-type GaAs layer 32: 0.1 to 0.5 μm; Si doping Si doping is executed at a carrier concentration of about $10^{17}/cm^3$.

An n-type metal electrode layer 33 is formed on the n-type GaAs layer 32. An Si substrate 34 is bonded to the surface of the Si substrate 34 to form a composite member 35 (FIG. 5A).

A high-pressure stream (water jet) W focused thinly is blown to the side surfaces of the separation assisting layer including the AlAs layer 26 and the separation layer including the InGaAs layer 27. Since the force (force to separate portions split into two substrates) of the water jet W to split the composite member 35 into two substrates is applied to both sides of the AlAs layer 18, the composite member 35 is split into two substrates. A surface emission type LED is formed on the n-type $Al_xGa_{1-x}As$ layer 29 (FIG. 5C). More specifically, an insulating layer 36 is formed on the entire surface by sputtering. A window is formed in the insulating layer 36 by photolithography and dry etching. A ZnSiO film is formed by sputtering. Then, thermal diffusion is executed to convert the window region into a p-type region 37. A p-type metal electrode 38 is formed on the p-type region 37.

In this way, a surface emission type LED device can be obtained.

Example 6

An InGaAs layer and GaAs layer are epitaxially grown on a GaAs substrate by MOCVD. The lattice constant of the InGaAs layer becomes large as the In composition increases. Mismatch to the lattice constant of the GaAs substrate increases as the In composition increases. Hence, a strain energy is generated in the InGaAs layer.

In this example, an InGaAs layer (thickness: 10 nm) having an In composition of 0.2 and a GaAs layer (thickness: 3 μm) are continuously epitaxially grown on the GaAs substrate.

The GaAs substrate is bonded to an Si substrate while setting the GaAs layer inside. Before bonding, a Cr film (thickness: 10 nm) and Au film (thickness: 200 nm) are sequentially formed on each of the surfaces of the GaAs layer and Si substrate. When the Au films on the surfaces are brought into tight contact with each other and heated under pressure, a composite member having a sufficient bonding strength can be obtained.

A force is applied for the side surface of the composite member to the InGaAs layer. More specifically, a so-called water jet to blow pure water pressurized to several MPa to 100 MPa from a thin nozzle with a diameter of 0.1 mm is blown to or near the side surface of the InGaAs layer. A crack spreading in the planar direction is formed in the InGaAs layer, and/or the interface between the InGaAs layer and the GaAs layer, and/or the interface between the InGaAs layer and the GaAs substrate so that the GaAs layer can be separated from the composite member (GaAs substrate).

With this process, a semiconductor substrate having the GaAs layer on the metal layers of Au and Cr on the Si substrate is obtained.

The separated GaAs substrate can be recycled. When a planarization process such as polishing or etching is executed for the surface of the separated GaAs substrate as needed, the GaAs substrate can repeatedly be used.

In this example, the separation layer having the strain energy is formed from the single InGaAs layer. The separation layer can also be formed from a plurality of layers having different In compositions.

For example, an InGaAs layer has a lattice constant larger than a GaAs substrate. When an InGaP layer or InGaAsP layer is employed in place of the InGaAs layer to make the lattice constant smaller than the GaAs substrate, compression strain can be present in the layer.

The GaAs layer and Si substrate are bonded through the Au films. However, the GaAs layer and Si, substrate can also be bonded directly by executing sputter cleaning on their surfaces in a vacuum state, bringing them into tight contact, and applying pressure.

Example 7

In this example, a separation assisting layer is provided to further facilitate separation.

An AlAs layer (thickness: 50 nm) serving as a separation assisting layer, InGaAs layer (thickness: 10 nm) having an In composition of 0.2 and serving as a separation layer, and GaAs layer (thickness: 3 μm) serving as a semiconductor film are continuously epitaxially grown on a GaAs substrate by MOCVD.

The GaAs substrate is bonded to an Si substrate while setting the GaAs layer inside. Before bonding, a Cr film (thickness: 10 nm) and Au film (thickness: 200 nm) are sequentially formed on each of the surfaces of the GaAs layer and Si substrate. When the Au films on the surfaces are brought into tight contact with each other and heated under pressure, a composite member having a sufficient bonding strength can be obtained.

To split the composite member near the AlAs layer and InGaAs layer, the periphery of the composite member is etched. A recessed portion is formed at the periphery of the composite member by using a solution mixture of sulfuric acid, hydrogen peroxide, and water as an etching solution. Etching of AlAs progresses at a speed much higher than GaAs and InGaAs. In addition, the oxide of AlAs oxidized by water is water-soluble. For these reasons, a region where the AlAs layer at the periphery of the composite member is selectively etched is formed.

A water jet to blow pure water pressurized to several MPa to 100 MPa from a thin nozzle with a diameter of 0.1 mm is blown to or near the recessed portion of the composite member. The AlAs layer exposed to pure water elutes as oxidation progresses. Since etching of the AlAs layer progresses quickly in addition to the force of water jet to split the composite member into two substrates, the composite member is split.

With the above process, a semiconductor substrate which has, on the Si substrate, the GaAs layer on the metal layers made of Au and Cu can be obtained.

In this example, a pair of separation layer and separation assisting layer is formed. For example, a plurality of pairs of separation layers and separation assisting layers may be formed. Layers each containing different In compositions may be formed as the separation layer and separation assisting layer.

Example 8

In this example, the separation layer has a layered structure including layers having lattice constants larger and smaller than the substrate.

An InGaAsP layer (thickness: 5 nm) having a lattice constant smaller than GaAs and an In composition of 0.28, an InGaAs layer (thickness: 5 nm) having a lattice constant larger than GaAs and an In composition of 0.2, and a GaAs layer (thickness: 3 μm) are continuously epitaxially grown on a GaAs substrate by MOCVD.

With this structure, a large strain energy is intensively present in the interface between the InGaAsP layer and the InGaAs layer. The lattice constants are averaged in the entire separation layer having the layered structure of the InGaAsP layer and InGaAs layer. For this reason, lattice constant mismatch at the interfaces between the GaAs substrate and the InGaAsP layer and between the InGaAs layer and the GaAs layer is relaxed. Hence, a GaAs layer having satisfactory crystallinity can be obtained.

Then, an Si substrate is bonded to the GaAs substrate, and separation is executed, as in Example 7.

Example 9

In this example, the separation layer is formed from a layer having a thermal expansion coefficient different from the substrate. According to this separation layer, lattice constant mismatch to the substrate and the semiconductor substrate on the separation layer can be made small. Hence, even when a thick semiconductor film is formed on the separation layer, defects can be suppressed as small as possible.

An InGaP layer (thickness: 20 nm) having almost the same lattice constant as GaAs and an In composition of 0.51 and a GaAs layer (thickness: 3 μm) are continuously epitaxially grown on a GaAs substrate.

The thermal expansion coefficient of the InGaP layer is $5.926 \times 10^{-6}$/deg. The thermal expansion coefficient of GaAs is $5.70 \times 10^{-9}$/deg. The difference between them is about 4.2%. However, since the lattice constants almost equal, lattice constant mismatch at the interfaces between the GaAs substrate and the InGaP layer and between the InGaP layer and the GaAs layer is relaxed. Hence, a GaAs layer having satisfactory crystallinity can be obtained.

Then, an Si substrate is bonded to the GaAs substrate, and separation is executed, as in Example 7.

Example 10

An $Al_2O_3$ substrate having a diameter of 8 inches is exposed to hydrogen at a high temperature of 1,000° C. or more and cleaned and planarized. An AlN layer is deposited to a thickness of 20 to 100 nm at 500° C. by MOCVD using hydrogen carrier gas, Ga and Al organic metal compounds, and $NH_3$ gas, thereby forming a buffer layer. The buffer layer has a microcrystalline grain boundary structure and is deposited at a low temperature of about 500° C. Hence, the buffer layer can be deposited spatially uniform and flat as compared to a layer grown at a high temperature of about 1,000° C. The microcrystalline grain size is ten-odd nm in AlN. The substrate temperature of the $Al_2O_3$ substrate is increased to about 1,000° C. A GaN layer is formed on the buffer layer. A pn-junction multilayered structure for the active layer of an LED is formed on the GaN layer.

A Pd film and Au film are sequentially deposited on the LED multilayered structure on the $Al_2O_3$ substrate to form a metal electrode layer. As another support substrate, an Si substrate having a diameter of 8 inches is prepared. An Al film and Sn film are sequentially formed on the surface of the Si substrate to form a metal electrode layer. The Al metal layer has a high reflectance in the UV region as compared to Au, as shown in FIG. 6.

The light emission wavelength of a GaN-based device is typically in the blue, violet, and UV regions, and an optimum reflecting metal must be selected in accordance with the wavelength. Referring to FIGS. 5A to 5C, Al and Rh are preferable to maintain the reflectance in the UV region.

After that, the electrode layer on the LED multilayered structure and the electrode layer on the Si substrate are brought into tight contact with each other. Annealing is executed at 300° C. to form an alloy of Au/Sn at the bonding interface to fuse the electrode layers. A composite member having a considerably increased bonding strength at the bonding interface was obtained.

The composite member is dipped in a phosphoric acid solution such that the AlN buffer layer to which strain and crystal defects concentrate retreats several ten μm from the end face to the center, thereby forming a recessed portion.

A convergent fluid of pure water which is focused to 0.1 mm is injected in the recessed portion at a pressure of 0.3 N while the composite member is rotated about an axis which passes through it almost perpendicularly. The $Al_2O_3$ substrate can be split in the AlN layer, and/or the interface between the AlN layer and the GaN layer, and/or the interface between the AlN layer and the $Al_2O_3$ substrate without damaging the GaN layer. As a result, the multilayered film having an LED structure formed on the $Al_2O_3$ substrate is transferred to the Si substrate.

The GaN layer to absorb the light emission wavelength of the LED is removed by chemical mechanical polishing (CMP). A Ti film and Al film are sequentially deposited to form an ohmic electrode. The ohmic electrode is patterned into a mesh shape.

When the LED device is cut into chips, LED chips can be obtained.

Example 11

A buffer layer formed from a GaN layer having a microcrystalline grain boundary structure is hetero-epitaxially grown on an $Al_2O_3$ substrate having a diameter of 8 inches by MOCVD, and a GaN layer is formed on it, as in Example 9.

A ridge laser diode device layer is stacked on the GaN layer. A Pd film and Au film are sequentially deposited on the device layer to form a metal electrode layer. As another support substrate, an Si substrate having a diameter of 8 inches is prepared. A Ti film, Au film, and Sn film are sequentially formed on the surface of the Si substrate to form a metal electrode layer.

After that, the electrode layer on the laser diode device layer and the electrode layer on the Si substrate are brought into tight contact with each other. Annealing is executed at 300° C. to form an alloy of Au/Sn at the bonding interface to fuse the electrode layers. A composite member having a considerably increased bonding strength at the bonding interface is obtained.

The composite member was dipped in a phosphoric acid solution such that the GaN buffer layer to which strain and crystal defects concentrate retreats several ten μm from the end face to the center, thereby forming a recessed portion.

A convergent fluid of pure water which is focused to 0.1 mm is injected in the recessed portion at a pressure of 0.3 N while the composite member is rotated about an axis which passes through it almost perpendicularly. The $Al_2O_3$ substrate can be split in the GaN buffer layer and/or the interface between the GaN layer and the $Al_2O_3$ substrate without damaging the GaN layer. As a result, the multilayered film having a laser diode structure formed on the $Al_2O_3$ substrate is transferred to the Si substrate.

Conventionally, the cleavage plane of the active layer is necessary for forming the resonator portion of a laser diode formed on an $Al_2O_3$ substrate. However, the mirror end face of the resonator is hard to form because of the poor cleavability of the $Al_2O_3$ substrate.

When an Si substrate having high cleavability is used as the support substrate of a GaN laser diode, as in this example, a resonator can easily be formed. In addition, since the laser is provided on the Si substrate which is excellent in heat dissipation, the power is efficiently supplied.

Example 12

A buffer layer formed from an AlN layer having a microcrystalline grain boundary structure is hetero-epitaxially grown on an $Al_2O_3$ substrate having a diameter of 8 inches by MOCVD, and a GaN layer is grown on it.

A device layer having a surface emitting laser (VCSEL) structure is formed on the GaN layer. A dielectric DBR mirror is deposited on a support substrate obtained by shaping Cu with excellent heat dissipation into 8 inches. The degree of freedom in material selection (refractive index) is higher in forming a dielectric DBR mirror on a support substrate than in forming a semiconductor DBR mirror during crystal growth. As a result, a high-performance reflecting mirror is formed, and the light emission efficiency of the surface emitting laser increases.

After that, the two substrates are brought into tight contact with each other. Annealing is executed to form a composite member having an increased bonding strength.

A convergent fluid of pure water is injected to the side surface of the AlN layer of the composite member to split it. The multilayered film having a laser diode structure provided on the dielectric DBR mirror with a high reflectance is transferred to the Si substrate.

Instead of the $Al_2O_3$ substrate, an SiC substrate can also be used.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004-185237 filed on Jun. 23, 2004, the entire contents of which are hereby incorporated by reference herein.

The invention claimed is:

1. A method of manufacturing a semiconductor film separated from a seed substrate, comprising:
   a step of forming a separation assisting layer on the seed substrate;
   a separation layer forming step of hetero-epitaxially growing a separation layer on the separation assisting layer;
   a semiconductor film forming step of forming a semiconductor film on the separation layer; and
   a separation step of separating, by using the separation layer, the semiconductor film from a composite member formed in the semiconductor film forming step,
   wherein the separation assisting layer is formed by using a material to be selectively etched with respect to the substrate and the separation layer.

2. The method according to claim 1, further comprising, before the separation step, a step of etching a periphery of the separation assisting layer.

3. The method according to claim 2, wherein in the separation step, a fluid is blown to or near the separation layer on a side surface of the composite member.

4. A method of manufacturing a semiconductor film separated from a seed substrate, comprising:
   a step of forming a separation assisting layer on the seed substrate;
   a separation layer forming step of hetero-epitaxially growing a separation layer on the separation assisting layer;
   a semiconductor film forming step of forming a semiconductor film on the separation layer; and
   a separation step of separating, by using the separation layer, the semiconductor film from a composite member formed in the semiconductor film forming step,
   wherein the separation assisting layer contains Al in a larger amount than layers in contact with the separation assisting layer.

5. A method of manufacturing a semiconductor film separated from a seed substrate, comprising:
   a step of forming a separation assisting layer on the seed substrate;
   a separation layer forming step of hetero-epitaxially growing a separation layer on the separation assisting layer;
   a semiconductor film forming step of forming a semiconductor film on the separation layer; and
   a separation step of separating, by using the separation layer, the semiconductor film from a composite member formed in the semiconductor film forming step,
   wherein the separation assisting layer is made of a material which satisfies $Al_xGa_{1-x}As$ (x>0.95).

6. A method of manufacturing a semiconductor film separated from a seed substrate, comprising:
   a separation layer forming step of hetero-epitaxially growing a separation layer on the seed substrate;
   a semiconductor film forming step of forming a semiconductor film on the separation layer;
   a bonding step of bonding the seed substrate on which the separation layer and the semiconductor film have been formed, to a handle substrate while setting the separation layer inside; and
   a separation step of separating the semiconductor film together with the handle substrate, by using the separation layer, from a composite member formed in the bonding step.

7. A method of manufacturing a semiconductor film separated from a seed substrate, comprising:
   a separation layer forming step of hetero-epitaxially growing a separation layer on the seed substrate;
   a semiconductor film forming step of forming a semiconductor film on the separation layer;
   a separation step of separating, by using the separation layer, the semiconductor film from a composite member formed in the semiconductor film forming step; and
   a device forming step of forming a semiconductor device on the semiconductor film.

8. The method according to claim 7, wherein the device forming step is executed before the bonding step.

9. The method according to claim 7, wherein the device forming step is executed after the separation step.

10. A method of manufacturing a semiconductor film separated from a seed substrate, comprising:
    a separation layer forming step of hetero-epitaxially growing a separation layer on the seed substrate;
    a semiconductor film forming step of forming a semiconductor film on the separation layer; and
    a separation step of separating, by using the separation layer, the semiconductor film from a composite member formed in the semiconductor film forming step,
    wherein another semiconductor film is manufactured by further executing the separation layer forming step and subsequent steps by using the seed substrate remaining after the separation step as a raw material.

11. A method of manufacturing a substrate having a semiconductor film, comprising:
    a separation layer forming step of hetero-epitaxially growing a separation layer on a seed substrate;
    a semiconductor film forming step of forming a semiconductor film on the separation layer;

a bonding step of bonding the seed substrate with the separation layer and the semiconductor film to a handle substrate while setting the separation layer inside; and a separation step of separating the semiconductor film, together with the handle substrate by using the separation layer, from a composite member formed in the bonding step to obtain a substrate having the semiconductor film on the handle substrate.

12. The method according to claim 11, further comprising a device forming step of forming a semiconductor device in the semiconductor film.

13. The method according to claim 12, wherein the device forming step is executed before the bonding step.

14. The method according to claim 12, wherein the device forming step is executed after the separation step.

15. The method according to claim 12, wherein the semiconductor device includes one of a light-emitting diode and a laser.

* * * * *

UNITED STATES PATENT AND TRADEMARK OFFICE
CERTIFICATE OF CORRECTION

PATENT NO. : 7,399,693 B2
APPLICATION NO. : 10/566170
DATED : July 15, 2008
INVENTOR(S) : Yoshinobu Sekiguchi Page 1 of 1

It is certified that error appears in the above-identified patent and that said Letters Patent is hereby corrected as shown below:

COLUMN 12:
Line 57, "$Al_{0.13}Ga_{0.87}$ layer 30:" should read -- $Al_{0.13}Ga_{0.87}$ As layer 30: --.

COLUMN 16:
Line 25, "microc-" should read -- micro- --; and
Line 26, "rystalline" should read -- crystalline --.

Signed and Sealed this

Third Day of March, 2009

JOHN DOLL
*Acting Director of the United States Patent and Trademark Office*